United States Patent
Chang et al.

(10) Patent No.: US 7,437,626 B2
(45) Date of Patent: Oct. 14, 2008

(54) EFFICIENT METHOD OF TEST AND SOFT REPAIR OF SRAM WITH REDUNDANCY

(75) Inventors: Tom Y. Chang, Fishkill, NY (US);
William V. Huott, Holmes, NY (US);
Thomas J. Knips, Wappinger Falls, NY (US); Donald W. Plass, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 660 days.

(21) Appl. No.: 11/056,726

(22) Filed: Feb. 11, 2005

(65) Prior Publication Data

US 2006/0181941 A1    Aug. 17, 2006

(51) Int. Cl.
*G11C 29/00* (2006.01)

(52) U.S. Cl. .................... 714/710; 714/733; 714/734

(58) Field of Classification Search ............... 714/710, 714/733, 734
See application file for complete search history.

(56) References Cited

U.S. PATENT DOCUMENTS

| 5,313,424 | A  | * | 5/1994 | Adams et al.    | 365/200 |
| 5,631,868 | A  | * | 5/1997 | Termullo et al. | 365/200 |
| 6,728,910 | B1 | * | 4/2004 | Huang           | 714/711 |
| 7,031,208 | B2 | * | 4/2006 | Satani et al.   | 365/200 |
| 7,260,758 | B1 | * | 8/2007 | Agrawal et al.  | 714/733 |

* cited by examiner

*Primary Examiner*—Mujtaba K Chaudry
(74) *Attorney, Agent, or Firm*—Lynn L. Augspurger

(57) ABSTRACT

Memory array built in self testing utilizing including a simple data history table. The table is used to track failing locations observed during any level of assembly test of processor or logic semiconductor chips where the chips contain SRAM macros with redundant elements for failure relief.

3 Claims, 2 Drawing Sheets

EFFICIENT METHOD OF TEST AND SOFT REPAIR OF SRAM WITH REDUNDANCY

FIELD OF THE INVENTION

Figure 1:
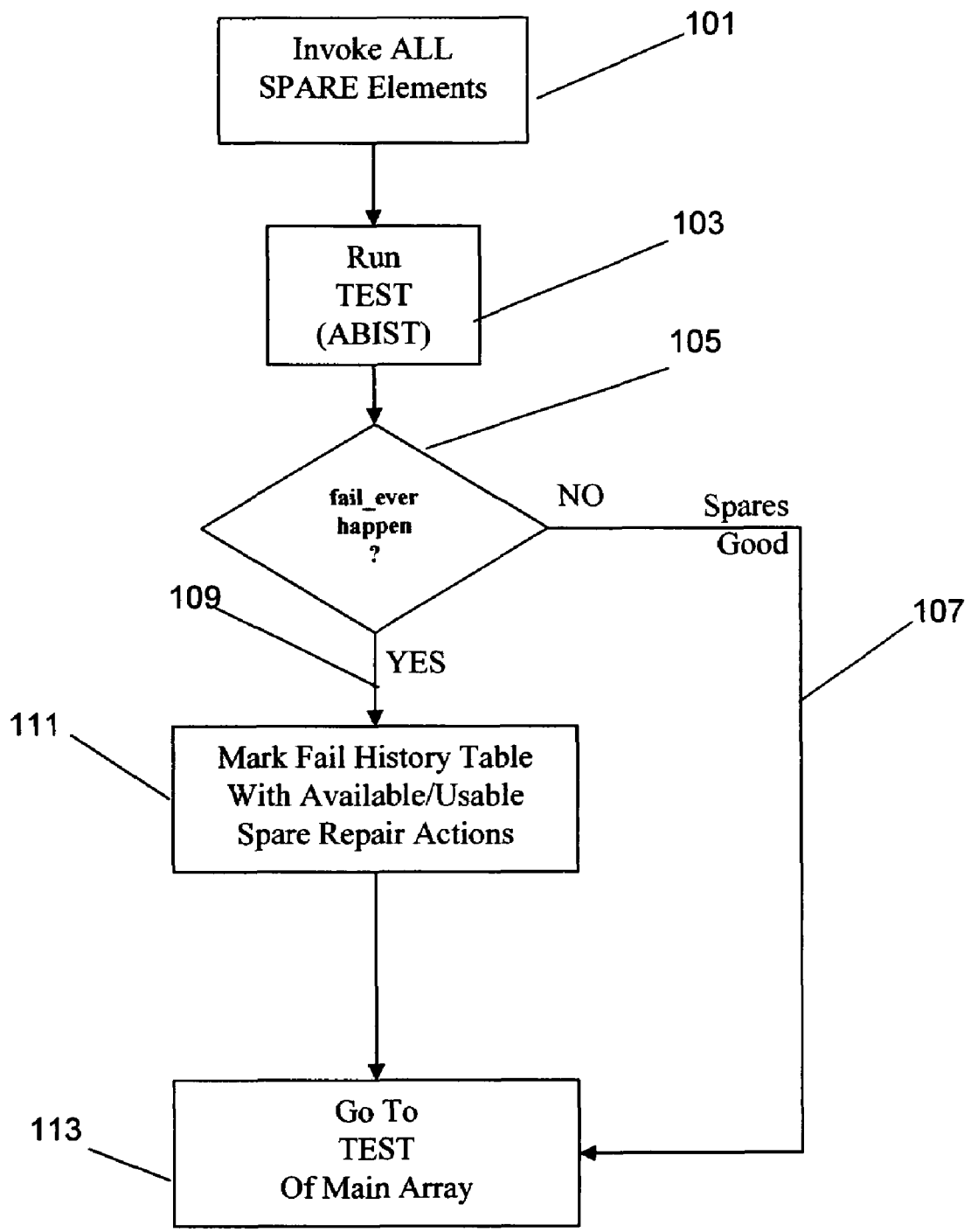

The invention described herein relates to memory array built in self testers for random access memory arrays with redundancy circuits for failure relief.

BACKGROUND OF THE INVENTION

Traditional testing methodologies of processor or logic semiconductor chips containing SRAM macros with redundant elements for failure relief include Array Built In Self Test (ABIST), and external test support equipment and data processing. These methods involve collection of data from the memory arrays regarding failing locations and some form of on chip fuse and/or latch structures to control the invocations of spare or redundant elements within the memory array elements for failure relief. This is sufficient when the redundant element circuitry performs a straightforward replacement of the defective elements with the memory array structure, enabling the spare elements to become active when a compare of the defective location address to the incoming address to the memory array is favorable.

Subsequent testing of the processor or logic semiconductor chip(s) containing SRAM macros with redundant elements. Further failure relief can be accommodated as long as the fuse or latch elements used for control of the redundant elements can be appended to, and thus provide further failure relief within the memory array structure. That is the case until the available number of repairable elements is exhausted, or at the point that the fuse or latch elements may no longer be appended or updated. This may occur with laser blown fuse elements later in the test and assembly process.

Another type of redundancy involves "skip over" redundant element techniques. In this case the spare element is no longer substituted for the defective element, but instead a spare is introduced and all replaceable elements internal to the memory array structure are shifted until the defective element is reached and no longer used. Traditional methodologies for test, fail detection and replacement can be used for "skip over" redundant elements if the replaceable elements are restricted to a single repairable element, or repair action within the memory array structure. The difficulty encountered at this point is in further data collection of subsequent levels of assembly test, where one must know if the redundant elements were invoked, to properly calculate internal memory array locations of subsequent fails. i.e. were the observed fails shifted from their base positions by the presence of a repair within the memory array.

A more general case is the provision to support multiple repairable elements (or spares) within the memory array. This provides techniques for the practical capability of multiple 'skip over' redundant or repairable memory array elements for SRAM macros. The problem created here, in terms of multiple levels of test and data collection for purposes of failure relief within the SRAM memory array elements, requires not only maintenance of a fail history of the device under test, but a maintenance of the redundancy configuration of the memory array at the time of that data collection or test point. This collected data must then be further analyzed and adjusted based on the repair configuration at the time of test, and precisely known at all levels of assembly test and data collection.

The support for two dimensional redundancy allocation is growing more complex for SRAM memory arrays with increased data IO widths (number of data bits into and out of the array) and the increased number of repair actions desired for yield improvement on high speed, high density SRAM products.

In addition, redundant elements in the SRAM macros are not restricted to just the address or data bit dimensions, but are now becoming increasingly a portion of the column addressing and data bit architecture of the SRAM. The thrust here has been to keep the size of the redundant element as small as possible for low overhead and high area efficiency, while increasing the overall number of repair actions available for failure relief of the memory array.

Therefore, it is becoming increasingly important to determine with more specificity where a failure has occurred in a memory array, for subsequent processing and generation of a failure relief condition of the memory array. In addition it is now an issue to know specifically the configuration of the memory array in terms of the redundant element configurations, for subsequent levels of test and data collection for failure relief within the memory array.

Another aspect of test of SRAM memory arrays with redundancy is the actual test of the redundant elements themselves. Traditional test and repair processes rely on a subsequent level of assembly test to provide test coverage of the elements used to provide failure relief within the memory array. This poses a concern if the test environments are sufficiently different to allow potential AOQL (average outgoing quality level) degradation for the repaired configurations, if subsequent levels of test to determine the original failures are not sufficiently repeated on the repaired configuration. Also, there is a producer cost risk associated with continued processing of a die that is not guaranteed to function at expected levels until late in the manufacturing process With increased levels of integration and scaling driving significant increases in the number of memory bits on a high performance processor chip, and significant development in using redundant elements to provide failure relief at all levels of assembly test in addition to initial fabrication test, it is becoming more important to provide efficient low cost test of redundant elements in addition to the main memory array fabrication tests.

A clear need exists to reduce the complexity of the data collection and process to establish continued repairable configurations of a memory array with redundant elements, and thereby reduce the test time and cost required.

There is also a clear need to reduce the overhead of the test data and processing for establishment of the redundant element configuration for failure relief of memory arrays with redundant circuits.

SUMMARY OF THE INVENTION

The method and system described herein provides a consistent test flow and repair methodology usable for all levels of assembly test, including a simple data history table. This table is used to track failing locations observed during any level of assembly test of processor or logic semiconductor chips containing SRAM macros with redundant elements for failure relief, by means of Array Built In Self Test (ABIST), or by external test support equipment and data processing. This data history table is then used as the basis for any repair solutions calculated to control the redundant element invocations of the SRAM for failure relief, whether it is from hard blown fuse technologies or a soft latch or register control approach. The only requirement on the SRAM redundancy circuit design is that there is a provision for disabling the repair solutions calculated, if any.

The elements of the disclosed methodology of test of SRAM memory arrays with redundancy, are that the redundant elements are tested first to determine overall availability of repair actions for failure relief within the memory array, and that the redundant elements must always be disabled during the data collection phase of the main array of the test process, whether it is for failure relief calculation or just for diagnostic data collection. This maintains a consistent and uniform fail history table that can then be analyzed with the same algorithm for "fuse" repair solution calculation at any level of assembly test. This consistent fail history table can also then be merged with data from subsequent test levels for repair accumulations through the build, burn-in, or even system level run-in test procedures.

It is noted that with this method, subsequent test activity is not precluded from being run with in-situ redundancy invocations of the redundant elements of the SRAM memory arrays, in fact is proposed, to be run with repairs enabled. The redundant elements are only disabled for the subsequent data collection of failing location data from the memory arrays.

THE FIGURES

FIG. 1 is a simplified depiction of the proposed test methodology flow of the redundant elements, involving a typical ABIST implementation represented by memory array test system support elements and their configuration. This flow depiction is of initial wafer level test passes, which could be composed of a plurality of tests or test environments.

Figure 2:
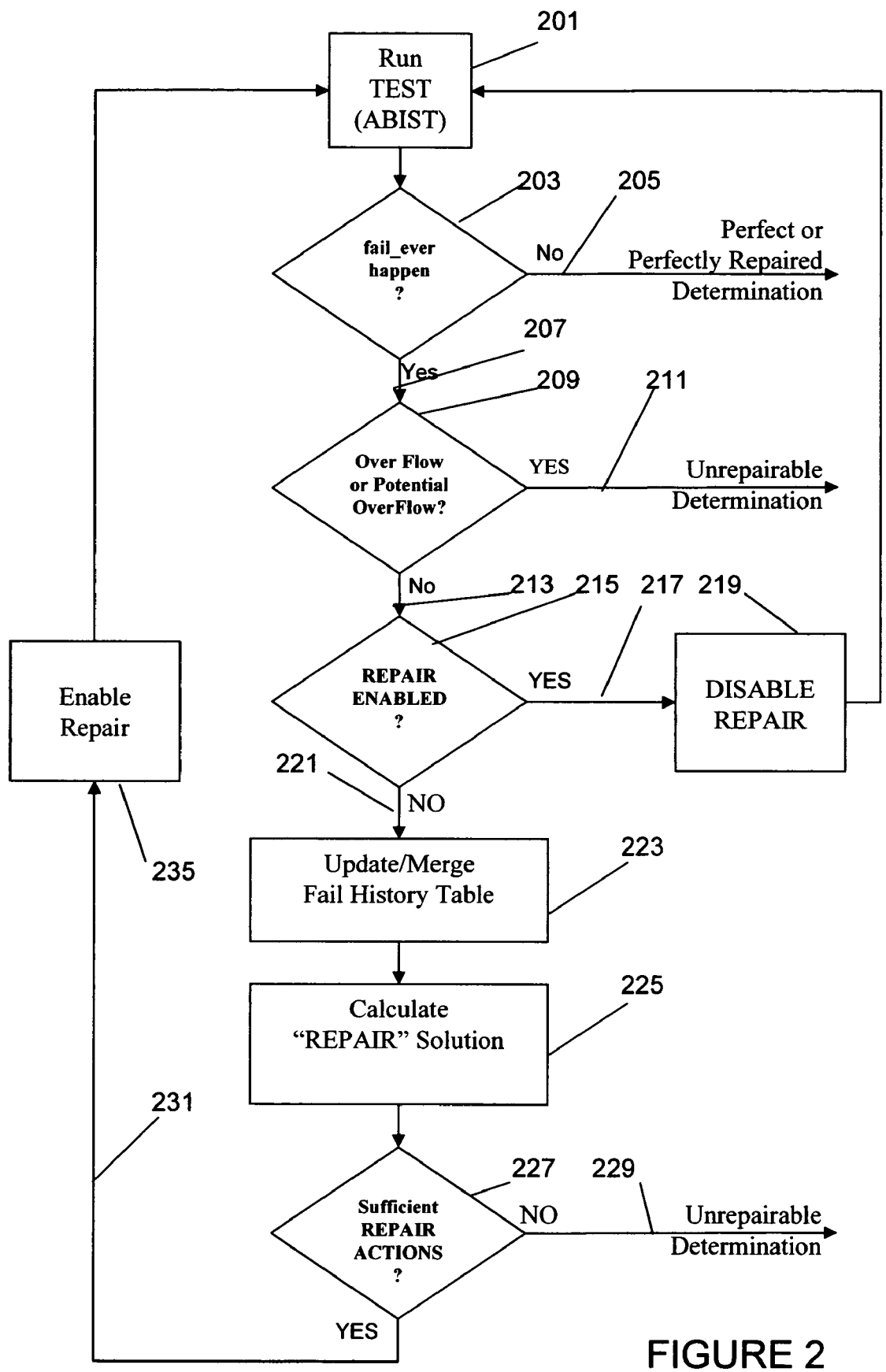

FIG. 2. is a simplified depiction of the proposed test methodology flow of the main array elements, again using, but not restricted to, typical ABIST configuration with support elements.

DETAILED DESCRIPTION OF THE INVENTION

One preferred embodiment of our invention will be described herein with relation to, but not restricted to, existing ABIST implementations, such as those described in patents which are mentioned below and incorporated herein by reference, including the patents of Huott et al., U.S. Pat. No. 5,633,877 entitled "Programmable Built-In Self-Test Controller for Arrays", and of Dreibelbis et al., U.S. Pat. No. 5,961,653 entitled "Processor based BIST for an embedded memory" issued Oct. 5, 1999, and the patent of Koch et al, U.S. Pat. No. 5,535,164 for a BIST tester for multiple memories and will further reference this as the ABIST test engine.

This preferred embodiment of our proposed methodology, begins with the complete substitution or exposure of the redundant or spare elements provided within the SRAM memory array, as depicted in FIG. 1 for test. This can be accomplished based on the provisions of the architecture of the SRAM memory array, either accessed as part of additional address space over the main array address space, or fully substituted as repairing the first repairable elements of the main array through the use of 'soft repair' latch or register control elements (non-permanent repair). As the test is performed of the spare elements alone, or of the main array with the redundant elements substituted as the lowest order addressable elements of the memory array, any resulting failures detected will first be within the spare element addressing areas, and are to be marked off in the Fail History Table as unavailable or un-usable for purposes of failure relief within the main array.

This now establishes the viability of the redundant elements for invocation at subsequent levels of assembly test or in-situ system repair. If there exists a situation where main array failures could potentially obscure adequate detection of failures within the spare elements, it is asserted here that the spare elements, given the ordering of substitution of the redundant elements consistent with the initial order of addressing in the test routine, will be identified first, and if not, will be invoked for failure relief of said obscuring fails early in the repair verification process, providing adequate test coverage and maintenance of AOQ levels.

This is illustrated in the flow chart of FIG. 1. As shown in the flow chart the first step is to invoke ALL SPARE elements 101, to run TEST (ABIST) 103, where there is a test if a fail ever happens 105. If "NO" as evidenced by "Spares Good" 107 the method continues to TEST of the main array 113. If, however a fail happens 109 the Fail History Table is marked with Available/Usable Spare Repair Actions 111, before proceeding to TEST of the Main Array 113.

At this point, the proposed test methodology is to proceed on the main array as depicted in FIG. 2. As the test proceeds 201 for initial (wafer/initial fabrication level) test of the main array test, no redundant elements are invoked (none known or required at this point). If the test completes 203 with no errors detected 205, the main memory array elements are deemed to be all good or 'perfect' and the process ends.

Given a test result that is a failing condition 207, the next test is to determine the case of catastrophic failure or failures 209 exceeding the maximum possible number of required repair actions, resulting in an un-repairable determination 211.

Given a test result that is a failing but not catastrophic condition 213, the test for prior repairs is performed to determine viability for data collection of the main array, without possible interference from internally shifted repairable elements within the memory array structure as described in the background of this disclosure. If prior repairs are enabled 215, e.g., indicated by "YES" 217, the disclosed methodology is to disable the repaired elements 219, and to repeat the test for data collection purposes by a return to run TEST (ABIST) 201. If no prior repairs are invoked 221, then data collection from the redundancy support function of the available test system is used to make entries into the Fail History Table for the memory array under test 223, calculate a REPAIR solution 225, and determine if there are sufficient available repair actions 227. If so, 231 repair is enabled 235 and the test is continued 201. If not 229, an unrepairable determination is made 229.

The Fail History Table is to be maintained through all levels of test and is a consistent repository for accumulated failures detected from test of the memory array structure, requiring relief through substitution of the spare or redundant elements. The "Repair" Solution calculation is the appropriate analysis of the recorded memory array failures and the determined repairable element substitution for relief of those failures.

The process is then to determine adequate availability of redundant elements and to invoke those elements to demonstrate viable failure relief within the memory array, with one more clean (no-failing) test pass in the repaired configuration.

All subsequent levels of assembly test can continue to take advantage of this proposed methodology, providing a consistent test flow, and a pure uncorrupted data log within the Fail History Table, enabling calculation updates if appropriate to the required repair solution, whether it be hard blown fuse control from wafer level test, or a soft "fuse" latch or register controls or supplements to a hard fuse implementation.

The invention may be implemented, for example, by having the system for running the test as a software application, in a dedicated processor, or in a dedicated processor with dedicated code. The code receives input from a user and/or from data, and executes a sequence of machine-readable instructions, which can also be referred to as code. These instructions may reside in various types of signal-bearing media. In this respect, one aspect of the present invention concerns a program product, comprising a signal-bearing medium or signal-bearing media tangibly embodying a program of machine-readable instructions executable by a digital processing apparatus to perform a method for circuit testing as a software application.

This signal-bearing medium may comprise, for example, memory in a server. The memory in the server may be non-volatile storage, a data disc, or even memory on a vendor server for downloading to a processor for installation. Alternatively, the instructions may be embodied in a signal-bearing medium such as the optical data storage disc. Alternatively, the instructions may be stored on any of a variety of machine-readable data storage mediums or media, which may include, for example, a "hard drive", a RAID array, a RAMAC, a magnetic data storage diskette (such as a floppy disk), magnetic tape, digital optical tape, RAM, ROM, EPROM, EEPROM, flash memory, magneto-optical storage, paper punch cards, or any other suitable signal-bearing media including transmission media such as digital and/or analog communications links, which may be electrical, optical, and/or wireless. As an example, the machine-readable instructions may comprise software object code, compiled from a language such as "C++", Java, Pascal, ADA, assembler, and the like.

Additionally, the program code may, for example, be compressed, encrypted, or both, and may include executable code, script code and wizards for installation, as in Zip code and cab code. As used herein the term machine-readable instructions or code residing in or on signal-bearing media include all of the above means of delivery.

While the foregoing disclosure shows a number of illustrative embodiments of the invention, it will be apparent to those skilled in the art that various changes and modifications can be made herein without departing from the scope of the invention as defined by the appended claims. Furthermore, although elements of the invention may be described or claimed in the singular, the plural is contemplated unless limitation to the singular is explicitly stated.

We claim:

1. A method for assembly test of semiconductor chips containing SRAM macros with redundant repair elements for failure relief, said method utilizing a failure history table and comprising the steps of:

a) first testing redundant elements to determine overall availability of repair actions for failure relief within the memory array;
   b) disabling calculated repair solutions during test;
   c) maintaining the failure history table for analysis with an algorithm used for repair solution calculation at any level of assembly test;
   d) merging the failure history table with data from subsequent test levels for repair accumulations through the build, bum-in, or even system level run-in test procedures;
   e) if a failing condition is found, a subsequent test is run to determine if failures exceed a maximum possible number of required repair actions, thereby resulting in an un-repairable determination;
   f) if no redundant elements are invoked for repair, the array elements are deemed to be all good and the test process is terminated;
   g) if a test result is failing the failure history table is interrogated to determine if there are sufficient available repair actions,
      i) if there are sufficient available repairs, repair is enabled and the test is continued; and
      ii) if there are not sufficient available repairs, an unrepairable determination is made;
      iii) wherein if a test result is failing the failure history table is interrogated to determine if there are sufficient available repair actions, and if the failures do not exceed a maximum possible number of repair operations, testing the failure history table for prior repairs to determine viability for data collection of the main array without possible interference from internally shifted repairable elements;
   h) if prior repairs have been enabled the repaired elements are disabled, and the test repeated in a test for data collection purposes; and
   i) if no prior repairs have been invoked, entries are made into the Fail History Table for the memory array under test.

2. The method of claim 1 comprising disabling calculated repair solutions during test and collecting failure data for failure relief calculation.

3. The method of claim 1 comprising calculated repair solutions during test and collecting failure data diagnostic data collection.

* * * * *